United States Patent
Yoon et al.

(10) Patent No.: US 10,742,018 B2
(45) Date of Patent: Aug. 11, 2020

(54) EARTH LEAKAGE CIRCUIT BREAKER

(71) Applicant: LSIS CO., LTD., Anyang-si, Gyeonggi-do (KR)

(72) Inventors: Jaeshik Yoon, Anyang-si (KR); Hyunyoung Jung, Anyang-si (KR); Jaeyoung Yu, Anyang-si (KR)

(73) Assignee: LSIS CO., LTD, Anyang-si, Gyeonggi-Do (KR)

( * ) Notice: Subject to any disclaimer, the term of this patent is extended or adjusted under 35 U.S.C. 154(b) by 161 days.

(21) Appl. No.: 16/193,861

(22) Filed: Nov. 16, 2018

(65) Prior Publication Data
US 2019/0173272 A1    Jun. 6, 2019

(30) Foreign Application Priority Data
Dec. 1, 2017 (KR) .................. 10-2017-0164259

(51) Int. Cl.
*H02H 3/33* (2006.01)
*H02H 3/52* (2006.01)
(Continued)

(52) U.S. Cl.
CPC ............ *H02H 3/33* (2013.01); *H02H 3/32* (2013.01); *H02H 3/52* (2013.01); *H02H 1/0007* (2013.01); *H02H 3/05* (2013.01)

(58) Field of Classification Search
CPC .......... H02H 3/05; H02H 1/007; H02H 3/32; H02H 3/33; H02H 3/52
See application file for complete search history.

(56) References Cited

U.S. PATENT DOCUMENTS

| 4,247,879 A | 1/1981 | Elms et al. |
| 6,025,980 A * | 2/2000 | Morron ............ H02H 1/04 361/115 |

(Continued)

FOREIGN PATENT DOCUMENTS

| GB | 2019677 A | 10/1979 |
| JP | H07222347 A | 8/1995 |

(Continued)

OTHER PUBLICATIONS

European Search Report for related European Application No. 18209668.5; action dated May 10, 2019; (10 pages).

(Continued)

*Primary Examiner* — Fred E Finch, III
*Assistant Examiner* — Rafael O De Leon Domenech
(74) *Attorney, Agent, or Firm* — K&L Gates LLP

(57) ABSTRACT

An earth leakage circuit breaker includes a current sensing unit configured to sense current in a circuit, a converter configured to detect a fundamental wave component and a specific harmonic component from the sensed current, the specific harmonic component being one of a plurality of harmonic components, and a controller. The controller is configured to compare a harmonic component ratio with a threshold component ratio, to determine whether the sensed current is abnormal current, and to control cutoff of the circuit according to the result of determination. The harmonic component ratio is a ratio of the specific harmonic component to the fundamental wave component. The converter is configured to convert the sensed current from an analog signal into digital data and to perform Fourier transform with respect to the converted digital data to detect the fundamental wave component and the specific harmonic component.

13 Claims, 4 Drawing Sheets

(51) Int. Cl.
*H02H 3/32* (2006.01)
*H02H 1/00* (2006.01)
*H02H 3/05* (2006.01)

(56) References Cited

U.S. PATENT DOCUMENTS

| | | | |
|---|---|---|---|
| 6,751,528 | B1 | 6/2004 | Dougherty |
| 8,817,431 | B2 | 8/2014 | Tomimbang et al. |
| 9,190,828 | B2 * | 11/2015 | Seon ................. H02H 3/08 |
| 9,541,580 | B2 * | 1/2017 | Nodera ............... H02H 1/0007 |
| 2004/0243288 | A1 | 12/2004 | Kito et al. |
| 2009/0121887 | A1 * | 5/2009 | Fong ..................... H02H 3/335 |
| | | | 340/650 |
| 2009/0316312 | A1 * | 12/2009 | Kim ..................... H02H 3/337 |
| | | | 361/42 |
| 2010/0213905 | A1 * | 8/2010 | Doumae ................ G01R 31/50 |
| | | | 320/166 |
| 2015/0192631 | A1 * | 7/2015 | Seon .................... G01R 31/50 |
| | | | 324/509 |
| 2017/0285087 | A1 * | 10/2017 | Onishi ................ G01R 35/005 |

FOREIGN PATENT DOCUMENTS

| | | |
|---|---|---|
| JP | 4488888 B2 | 6/2010 |
| JP | 4908245 B2 | 4/2012 |
| JP | 2016144297 A | 8/2016 |
| JP | 6138353 B2 | 5/2017 |
| JP | 6149546 B2 | 6/2017 |
| JP | 2017159720 A | 9/2017 |
| KR | 20030028670 A | 4/2003 |
| KR | 20100132316 A | 12/2010 |
| KR | 101510617 B1 | 4/2015 |
| KR | 101641516 B1 | 7/2016 |

OTHER PUBLICATIONS

Korean Office Action for related Korean Application No. 10-2017-0164259; action dated Aug. 31, 2018; (5 pages).

* cited by examiner

EARTH LEAKAGE CIRCUIT BREAKER

CROSS-REFERENCE TO RELATED APPLICATION

Pursuant to 35 U.S.C. § 119(a), this application claims the benefit of earlier filing date and right of priority to Korean Application No. 10-2017-0164259 filed on Dec. 1, 2017, whose entire disclosures are herein incorporated by reference.

BACKGROUND

Embodiments relate to an earth leakage circuit breaker configured to protect a circuit.

In general, an earth leakage circuit breaker detects abnormal current in a circuit due to leakage or grounding and cuts off the circuit. Therefore, the earth leakage circuit breaker protects facilities and persons at a load end. That is, the earth leakage circuit breaker detects a peak current value from current sensed in the circuit and compares the peak current value with a predetermined current value. At this time, the peak current value may be detected from a fundamental wave component or a harmonic component of current. In addition, when the peak current value is equal to or greater than the predetermined current value, the earth leakage circuit breaker cuts off the circuit.

However, the earth leakage circuit breaker may malfunction. That is, the peak current value may be detected from the harmonic component of current according to the characteristics of a specific part in the earth leakage circuit breaker. Thus, even if abnormal current is not generated, the earth leakage circuit breaker may cut off the circuit based on the peak current value.

SUMMARY

According to various embodiments, it is possible to prevent malfunction of an earth leakage circuit breaker. That is, the earth leakage circuit breaker may ignore current sensed according to the characteristics of a specific part of the earth leakage circuit breaker at the time of detection of abnormal current. Therefore, the earth leakage circuit breaker can more efficiently detect abnormal current, thereby protecting a circuit.

According to various embodiments, an earth leakage circuit breaker includes a current sensing unit configured to sense current in a circuit, a converter configured to detect a fundamental wave component and a specific harmonic component from the sensed current, the specific harmonic component being one of a plurality of harmonic components and a controller. The controller is configured to compare a harmonic component ratio with a threshold component ratio, to determine whether the sensed current is abnormal current, and to control cutoff of the circuit according to the result of determination. The harmonic component ratio may be a ratio of the specific harmonic component to the fundamental wave component. The converter is configured to convert the sensed current from an analog signal into digital data, and to perform Fourier transform with respect to the converted digital data to detect the fundamental wave component and the specific harmonic component.

The abnormal current may be caused by leakage.

The controller may compare a current value of the detected fundamental wave component with a predetermined reference current value and determine whether the sensed current is abnormal current.

The abnormal current may be caused by grounding.

The controller may determine whether the sensed current is abnormal current by a predetermined count upon determining that the current is abnormal current.

The controller may perform control to drive a cutoff unit to cut off the circuit, if the sensed current is abnormal current.

The reference current value may include a first reference current value set according to sensitivity of the abnormal current and a second reference current value set to distinguish the abnormal current and exceeding the first reference current value.

The controller may determine that the current is abnormal current due to grounding, if the current value of the fundamental wave component exceeds the second reference current value.

The controller may compare the harmonic component ratio with a predetermined threshold component ratio if a current value of the fundamental wave component is equal to or greater than the first reference current value and is equal to or less than the second reference current value, and determine that the current is abnormal current due to leakage if the harmonic component ratio is less than the threshold component ratio.

The controller may determine that the current is balanced current, if the current value of the fundamental wave component is less than the first reference current value or if the harmonic component ratio is equal to or greater than the threshold component ratio.

The controller may compare the fundamental wave component ratio of the sensed current with a predetermined range if the current value of the fundamental wave component is equal to or greater than the reference current value, compare the harmonic component ratio of the sensed current with a predetermined threshold component ratio if the fundamental wave component is out of the range, determine whether the current is abnormal current if the fundamental wave component ratio is in the range or if the harmonic component ratio is less than the threshold component ratio, and determine that the current is balanced current if the current value of the fundamental wave component is less than the reference current value or if the harmonic component ratio is equal to or greater than the threshold component ratio.

The controller may compare the fundamental wave component ratio of the sensed current with a predetermined range if the current value of the fundamental wave component is equal to or greater than the reference current value, compare a peak current value of the sensed current with a predetermined threshold current value if the fundamental wave component is out of the range, determine whether the current is abnormal current if the fundamental wave component ratio is in the range or if the peak current value exceeds the threshold current value, and determine that the current is balanced current if the current value of the fundamental wave component is less than the reference current value or if the peak current value is equal to or less than the threshold current value.

The controller may increase a detection count of the abnormal current upon determining that the current is abnormal current, cut off the circuit if the detection count reaches a predetermined count, and initialize the detection count of the abnormal current upon determining that the current is balanced current.

According to various embodiments, the earth leakage circuit breaker may determine whether abnormal current is generated based on the fundamental wave component of the current sensed from the circuit. That is, the earth leakage circuit breaker may ignore current generated according to the characteristics of a specific part in the earth leakage circuit breaker, when determining whether abnormal current is generated. In addition, the earth leakage circuit breaker may determine whether abnormal current is generated, by additionally considering at least one of the harmonic component of the current sensed in the circuit or the peak current value. Therefore, it is possible to improve accuracy when the earth leakage circuit breaker determines whether abnormal current is generated. Therefore, it is possible to prevent malfunction of the earth leakage circuit breaker.

DETAILED DESCRIPTION OF THE EMBODIMENTS

Figure 1:
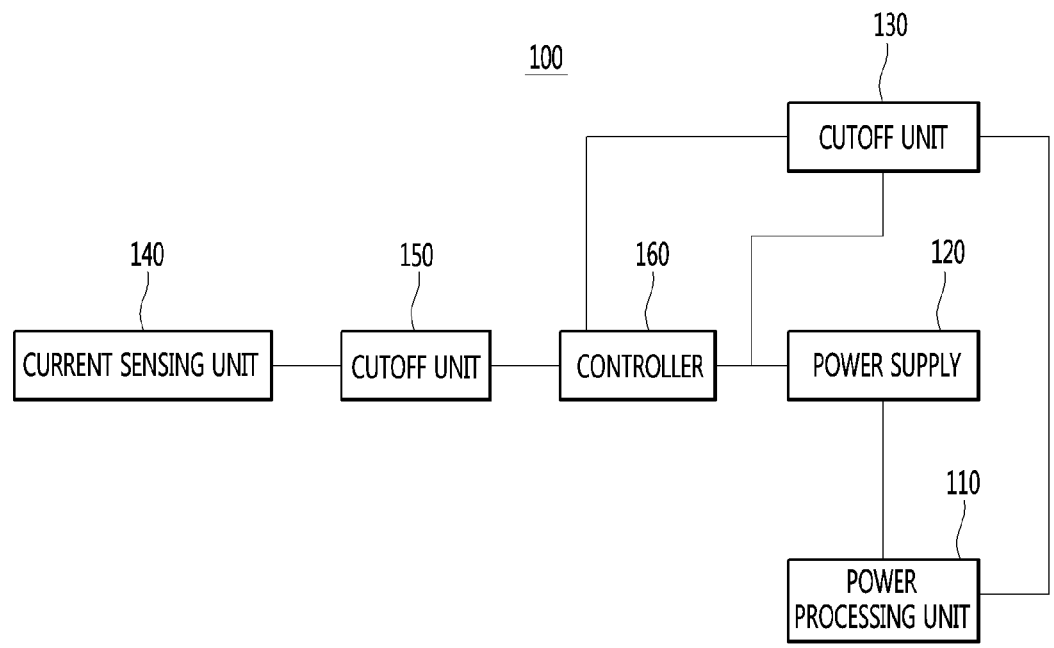
FIG. 1 is a block diagram showing an earth leakage circuit breaker according to various embodiments.

Hereinafter, various embodiments of the present disclosure will be described with reference to the accompanying drawings. However, it should be understood that the techniques described in this disclosure are not intended to limit the particular embodiments, but include various modifications, equivalents, and/or alternatives. In the description of the drawings, like reference numerals denote like elements.

In the present disclosure, the term 'have', 'may have', 'include', or 'may include' signifies the presence of a specific feature, such as number, function, operation or part, not excluding the presence or addition of one or more other features.

While ordinal numbers including 'first', 'second', etc. used in this disclosure may be used to describe various components regardless of the order and/or importance thereof, they are not intended to limit the components. These expressions may be used to distinguish one component from another component.

Figure 2:
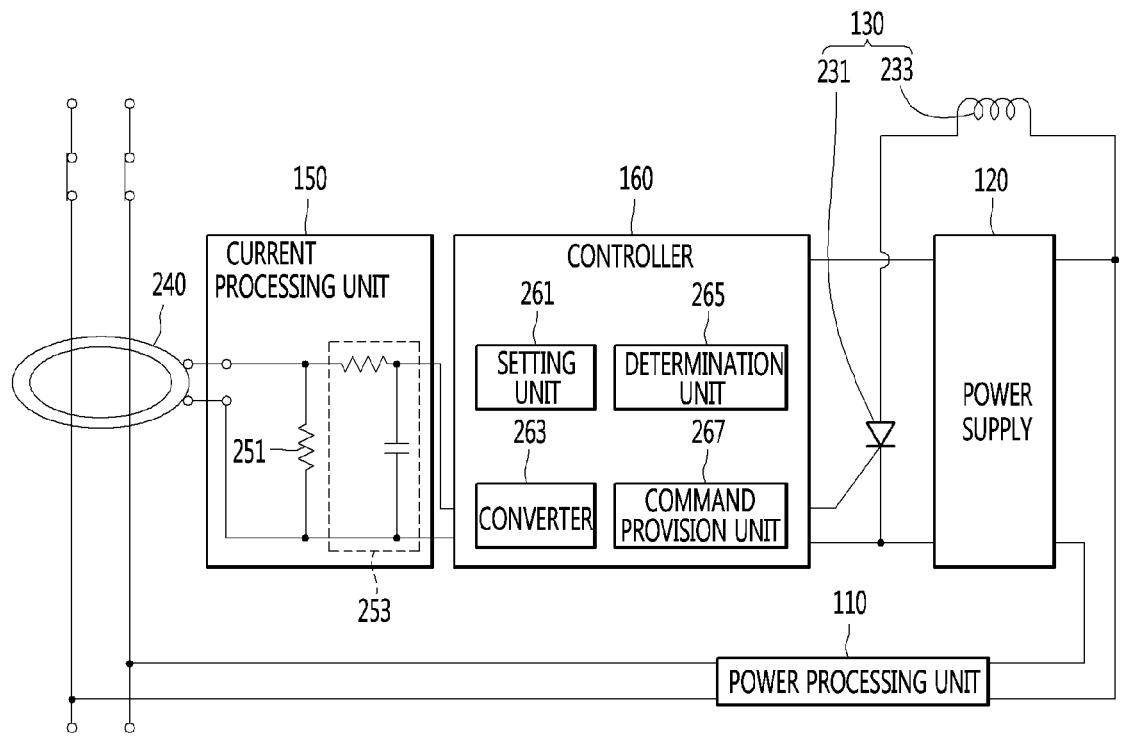
FIG. 2 is a circuit diagram showing an earth leakage circuit breaker according to one embodiment.

FIG. 1 is a block diagram showing an earth leakage circuit breaker 100 according to various embodiments, and FIG. 2 is a circuit diagram showing the earth leakage circuit breaker 100 according to one embodiment.

Referring to FIG. 1, the earth leakage circuit breaker 100 according to the various embodiments may include a power processing unit 110, a power supply 120, a cutoff unit 130, a current sensing unit 140, a current processing unit 150 and a controller 160.

The power processing unit 110 may process power supplied to a circuit. For example, the power processing unit 110 may convert AC power into DC power. For example, the power processing unit 110 may send the DC power to the power supply 120.

The power supply 120 may supply power for operation of the earth leakage circuit breaker 100. For example, the power supply 120 may supply power to the cutoff unit 130 and the controller 160. The power supply 120 may receive the DC power from the power processing unit 110 and supply the DC power to the cutoff unit 130 and the controller 160.

The cutoff unit 130 may cut off the circuit under control of the controller 160. For example, the cutoff unit 130 may cut off the circuit in response to a drive command of the controller 160. According to one embodiment, the cutoff unit 130 may include a thyristor 231 and a trip coil 233, as shown in FIG. 2.

The thyristor 231 may be activated in response to the drive command of the controller 160.

When the drive command is received from the controller 160, the thyristor 231 may operate the trip coil 233. The trip coil 233 may is operated by the thyristor 231 such that the circuit is cut off.

The current sensing unit 140 may sense current induced in the circuit. For example, the current sensing unit 140 may sense current induced in the circuit when the vector sum of a magnetic field generated from the circuit is not zero. According to one embodiment, the current sensing unit 140 may include a zero current transformer (ZCT) 240 as shown in FIG. 2.

The current processing unit 150 may process the current sensed by the current sensing unit 140. The current processing unit 150 may output current as an analog signal. Current may include a fundamental wave component and a plurality of harmonic components. According to one embodiment, the current processing unit 150 may include a shunt resistor 251 and a noise filter 253, as shown in FIG. 2.

The shunt resistor 251 may be connected to the current sensing unit 140 in parallel to extend the range of current sensed by the current sensing unit 140. The noise filter 253 may eliminate noise from current. For example, the noise filter 253 may be a low pass filter and may include a resistor and a capacitor connected to each other in parallel.

The controller 160 may determine whether the current sensed by the current sensing unit 140 is abnormal current. Abnormal current indicates unbalanced current caused by leakage or grounding, and may be distinguished from balanced current. The controller 160 may determine whether the current sensed by the current sensing unit 140 is abnormal current at a predetermined time interval. For example, the time interval may be 10 milliseconds (ms). For example, the controller 160 may determine whether current is abnormal current based on the fundamental wave component of the current. For example, the controller 160 may determine whether current is abnormal current, by additionally considering at least one of the harmonic component of the current or a peak current value. When the current has abnormal current, that is, unbalanced current, the controller 160 may drive the cutoff unit 130. Meanwhile, when the current has balanced current, the controller 160 may maintain the current drive state of the cutoff unit 130 without driving the cutoff unit 130. According to one embodiment, the controller 160 may include a setting unit 261, a converter 263, a determination unit 265 and a command provision unit 267.

According to various embodiments, the earth leakage circuit breaker may determine whether abnormal current is generated based on the fundamental wave component of the current sensed from the circuit. That is, the earth leakage circuit breaker may ignore current generated according to the characteristics of a specific part in the earth leakage circuit breaker, when determining whether abnormal current is generated. In addition, the earth leakage circuit breaker may determine whether abnormal current is generated, by additionally considering at least one of the harmonic component of the current sensed in the circuit or the peak current value. Therefore, it is possible to improve accuracy when the earth leakage circuit breaker determines whether abnormal current is generated. Therefore, it is possible to prevent malfunction of the earth leakage circuit breaker.

The setting unit 261 may set at least one comparison parameter. For example, the comparison parameter may include the current value of the fundamental wave component, that is, at least one of a reference current value for comparison with the current value of the fundamental wave component, a threshold component ratio for comparison with a harmonic component ratio indicating the ratio of the fundamental wave component to current, a component ratio range for comparison with the fundamental wave component ratio indicating the ratio of the fundamental wave component to current, a threshold current value for comparison with the peak current value to current or the cutoff count for comparison with the detection count of abnormal current. The reference current value may include a first reference current value set according to sensitivity of abnormal current and a second reference current value set to distinguish abnormal current and exceeding the first reference current value.

The converter 263 may convert current. For example, the converter 263 may include an analog-to-digital converter (ADC) and a Fourier transformer. The analog-to-digital converter may convert current from an analog signal into digital data. For example, the analog-to-digital converter may sample the analog signal in a time region and convert the analog signal into the digital data. The Fourier transformer may perform Fourier transform with respect to the digital data. For example, Fourier transform may include discrete Fourier transform (DFT). The converter 263 may detect at least one of a fundamental wave component, a harmonic component or a peak current value.

At least one of the setting unit 261, the converter 263, the determination unit 265 and the command provision unit 267 may not be included in the controller and may be separately configured.

The determination unit 265 may determine whether the current is abnormal current based on at least one of the fundamental wave component, the harmonic component or the peak current value. To this end, the determination unit 265 may compare at least one of the fundamental wave component, the harmonic component or the peak current value with the comparison parameter. Here, upon determining that the current is abnormal current, the determination unit 265 may increase the detection count. For example, the determination unit 265 may increase the detection count from 0 to 1 or from 3 to 4 by 1. Meanwhile, upon determining that the current has balanced current, the determination unit 265 may initialize the detection count to 0.

The command provision unit 267 may provide the drive command to the cutoff unit 130 based on the result of determination of the determination unit 265. At this time, when the determination unit 265 determines that the current is abnormal current, the command provision unit 267 may provide the drive command to the cutoff unit 130. Here, when the detection count reaches the cutoff count, the command provision unit 267 may provide the drive command to the cutoff unit 130.

Figure 3:
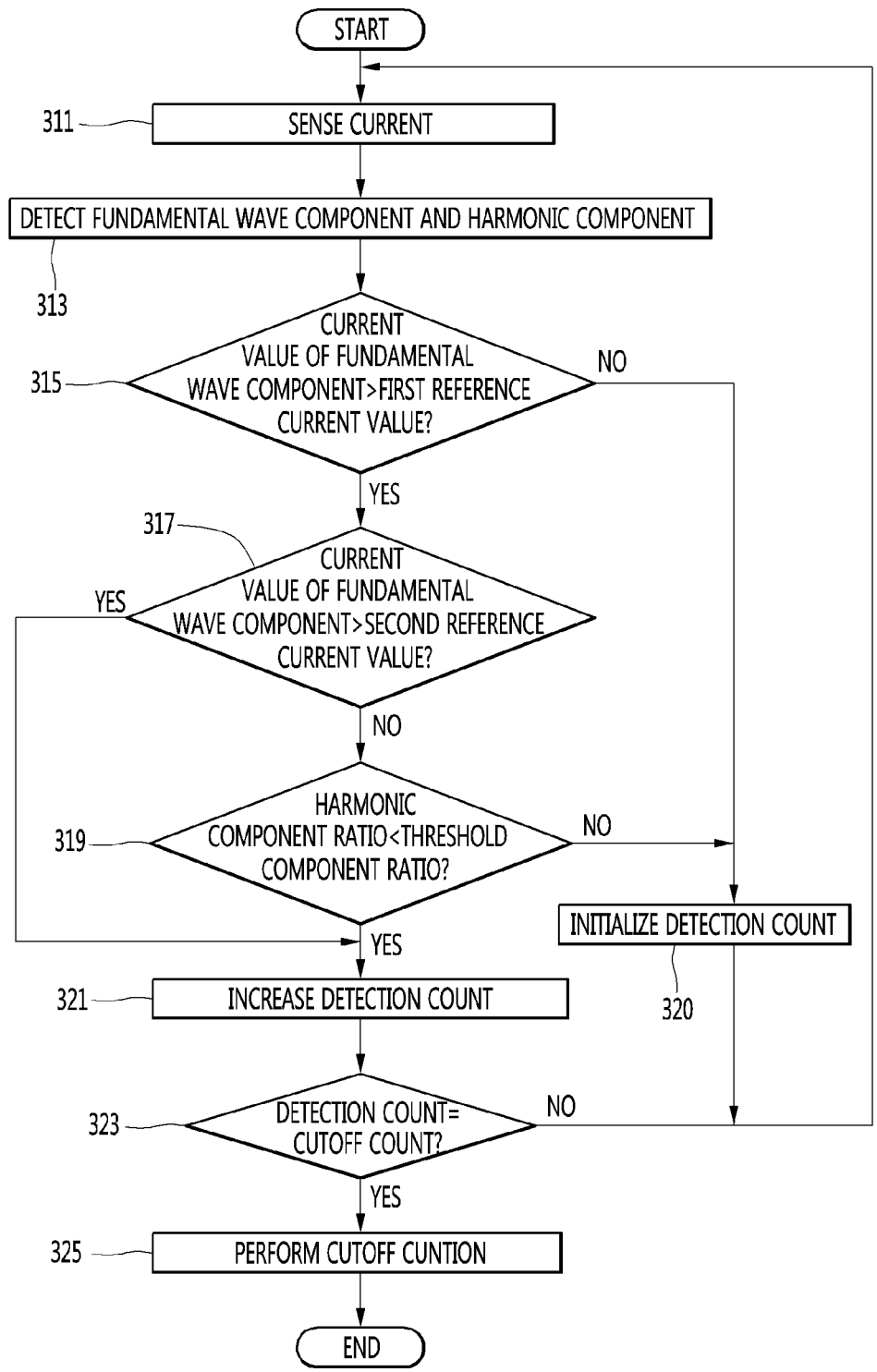
FIG. 3 is a flowchart illustrating a method of operating an earth leakage circuit breaker according to one embodiment.

FIG. 3 is a flowchart illustrating a method of operating an earth leakage circuit breaker 100 according to one embodiment.

Referring to FIG. 3, in the method of operating the earth leakage circuit breaker 100 according to the embodiment, the current sensing unit 140 senses current induced in the circuit in Operation 311. While the current sensing unit 140 senses current in Operation 311, the controller 160 may detect a fundamental wave component and a specific harmonic component of a plurality of harmonic components from the current in Operation 313.

The controller 160 may detect the fundamental wave component and a third harmonic component from the current.

The third harmonic component may indicate the harmonic component having a frequency which is three times that of the fundamental wave component. To this end, the controller 160 may convert current from an analog signal into digital data and then perform Fourier transform with respect to the digital data.

Next, the controller 160 may compare the current value of the fundamental wave component with a predetermined first reference current value in Operation 315. At this time, the controller 160 may determine whether the current value of the fundamental wave component is equal to or greater than the first reference current value. Here, the first reference current value indicates a reference value for distinguishing sensitivity of abnormal current, which needs to be set by the earth leakage circuit breaker 100, and may be set to any one in a range of 0 to 10 A, for example. For example, the first reference current value may be set to any one in a range of 0 to 100 mA if the earth leakage circuit breaker 100 has high sensitivity, may be set to any one in a range of 100 mA to 2 A if the earth leakage circuit breaker 100 has moderate sensitivity, and may be set to any one in a range of 2 A to 10 A if the earth leakage circuit breaker 100 has low sensitivity.

Upon determining that the current value of the fundamental wave component is equal to or greater than the first reference current value in Operation 315, the controller 160 may compare the current value of the fundamental wave component with a predetermined second reference current value in Operation 317. At this time, the controller 160 may determine whether the current value of the fundamental wave component exceeds the second reference current value. The second reference current value may indicate a reference value for distinguishing between abnormal current and balanced current. For example, the second reference current value may be set to 2.5 A.

Next, upon determining that the current value of the fundamental wave component exceeds the second reference current value in Operation 317, the controller 160 may increase the detection count in Operation 321. That is, when the current value of the fundamental wave component exceeds the second reference current value, the controller 160 may determine that the current is abnormal current. For example, when the current value of the fundamental wave component exceeds the second reference current value, the controller 160 may determine that abnormal current is generated due to grounding. Then, the controller 160 may increase the detection count in correspondence with abnormal current. For example, the controller 160 may increase the detection count from 0 to 1 or from 3 to 4 by 1. Here, the detection count being 1 indicates that abnormal current is generated for 10 ms, the detection count being 2 indicates that abnormal current is generated for 20 ms, and the detection count being 10 indicates that abnormal current is generated for 100 ms. The controller 160 may determine whether the detection count reaches the predetermined cutoff count in Operation 323. For example, the cutoff count may be set to 10.

Finally, upon determining that the detection count reaches the predetermined cutoff count in Operation 323, the controller 160 may generate and provide the drive command to the cutoff unit 130 in order to perform the cutoff function in Operation 325. At this time, the controller 160 may drive the cutoff unit 130 in response to the drive command, thereby cutting off the circuit. Then, the method of operating the earth leakage circuit breaker 100 according to the embodiment may be finished.

Meanwhile, upon determining that the current value of the fundamental wave component is equal to or less than the second reference current value in Operation 317, the controller 160 may compare the harmonic component ratio with a predetermined threshold component ratio in Operation 319. For example, the controller 160 may compare the third harmonic component ratio with the threshold component ratio. The third harmonic component ratio may mean a ratio of the third harmonic component to the fundamental wave component. The controller 160 may determine whether the third harmonic component ratio is less than the threshold component ratio. For example, the threshold component ratio may be 50%.

Upon determining that the harmonic component ratio is less than the threshold component ratio in Operation 319, the controller 160 may proceed to Operation 321. That is, if the harmonic component ratio is less than the threshold component ratio, the controller 160 may determine that the current is abnormal current. For example, if the harmonic component ratio is less than the threshold component ratio, the controller 160 may determine that abnormal current is generated due to leakage.

Meanwhile, upon determining that the current value of the fundamental wave component is less than the first reference current value in Operation 315, the controller 160 may initialize the detection count to 0 in Operation 320. That is, if the current value of the fundamental wave component is less than the first reference current value, the controller 160 may determine that the current is balanced current. Meanwhile, upon determining that the harmonic component ratio is equal to or greater than the threshold component ratio in Operation 319, the controller 160 may initialize the detection count in Operation 320. That is, if the third harmonic component ratio is equal to or greater than the threshold component ratio, the controller 160 may determine that the current is balanced current. In this case, the current may be generated due to the characteristics of the specific part in the earth leakage circuit breaker 100. Thereafter, the controller 160 may be returned to Operation 311. In addition, the controller 160 may perform at least one of Operation 311 to Operation 323.

Figure 4:
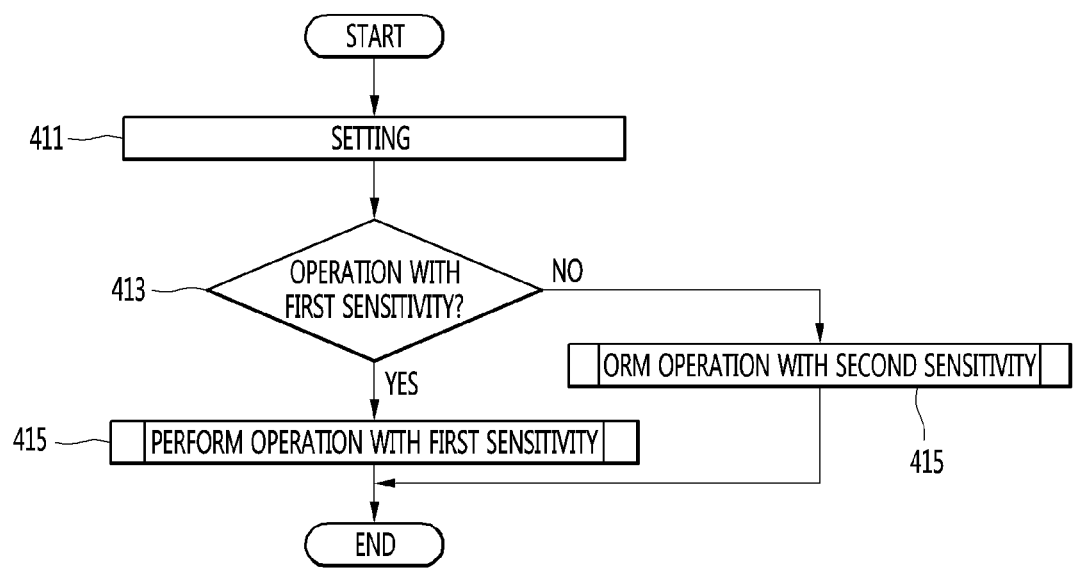
FIG. 4 is a flowchart illustrating a method of operating an earth leakage circuit breaker according to another embodiment.

FIG. 4 is a flowchart illustrating a method of operating an earth leakage circuit breaker 100 according to another embodiment.

Referring to FIG. 4, in the method of operating the earth leakage circuit breaker 100 according to another embodiment, first, the controller 160 may perform setting for performing an earth leakage circuit breaking function in Operation 411. At this time, the controller 160 may set at least one comparison parameter. The comparison parameter may include the current value of the fundamental wave component, that is, at least one of a reference current value for comparison with the current value of the fundamental wave component, a threshold component ratio for comparison with a harmonic component ratio of current, a component ratio range for comparison with the fundamental wave component ratio indicating the ratio of the fundamental wave component of current, a threshold current value for comparison with the peak current value of current or the cutoff count for comparison with the detection count of abnormal current. The reference current value may include a first reference current value set according to sensitivity of abnormal current and a second reference current value set to distinguish abnormal current and exceeding the first reference current value.

Next, the controller 160 may determine whether operation is performed with first sensitivity in Operation 413. At this time, the controller 160 may determine whether operation is performed with first sensitivity or second sensitivity based on the first reference current value. Here, the first sensitivity may indicate high sensitivity and moderate sensitivity and the second sensitivity may indicate low sensitivity. For example, the controller 160 may determine whether the first reference current value is equal to or less than 2 A.

In other words, the controller 160 may determine that operation is performed with any one of high sensitivity, moderate sensitivity or low sensitivity. For example, if the first reference current value is set to any one in a range of 0 to 100 mA, the controller 160 may determine that operation is performed with high sensitivity. Meanwhile, if the first reference current value is set to any one in a range of 100 mA to 2 A, the controller 160 may determine that operation is performed with moderate sensitivity. Meanwhile, if the first reference current value is set to any one in a range of 2 A to 10 A, the controller 160 may determine that operation is performed with low sensitivity.

Next, upon determining that operation is with the first sensitivity in Operation 413, the controller 160 may perform operation with the first sensitivity in Operation 415. For example, upon determining that the first reference current value is equal to or less than 2 A, the controller 160 may perform operation with the first sensitivity. At this time, operation performed by the controller 160 with the first sensitivity is similar to the above-described embodiment and thus a detailed description thereof will be omitted. That is, the controller 160 may perform operation with the first sensitivity as shown in FIG. 3. Then, the method of operating the earth leakage circuit breaker 100 according to another embodiment may be finished.

Meanwhile, upon determining that operation is performed with the second sensitivity in Operation 413, the controller 160 may perform operation with the second sensitivity in Operation 417. For example, upon determining that the first reference current value exceeds 2 A, the controller 160 may perform operation with the second sensitivity.

Then, the method of operating the earth leakage circuit breaker 100 according to another embodiment may be finished. At this time, operation performed by the controller 160 with the second sensitivity is as follows.

Figure 5:
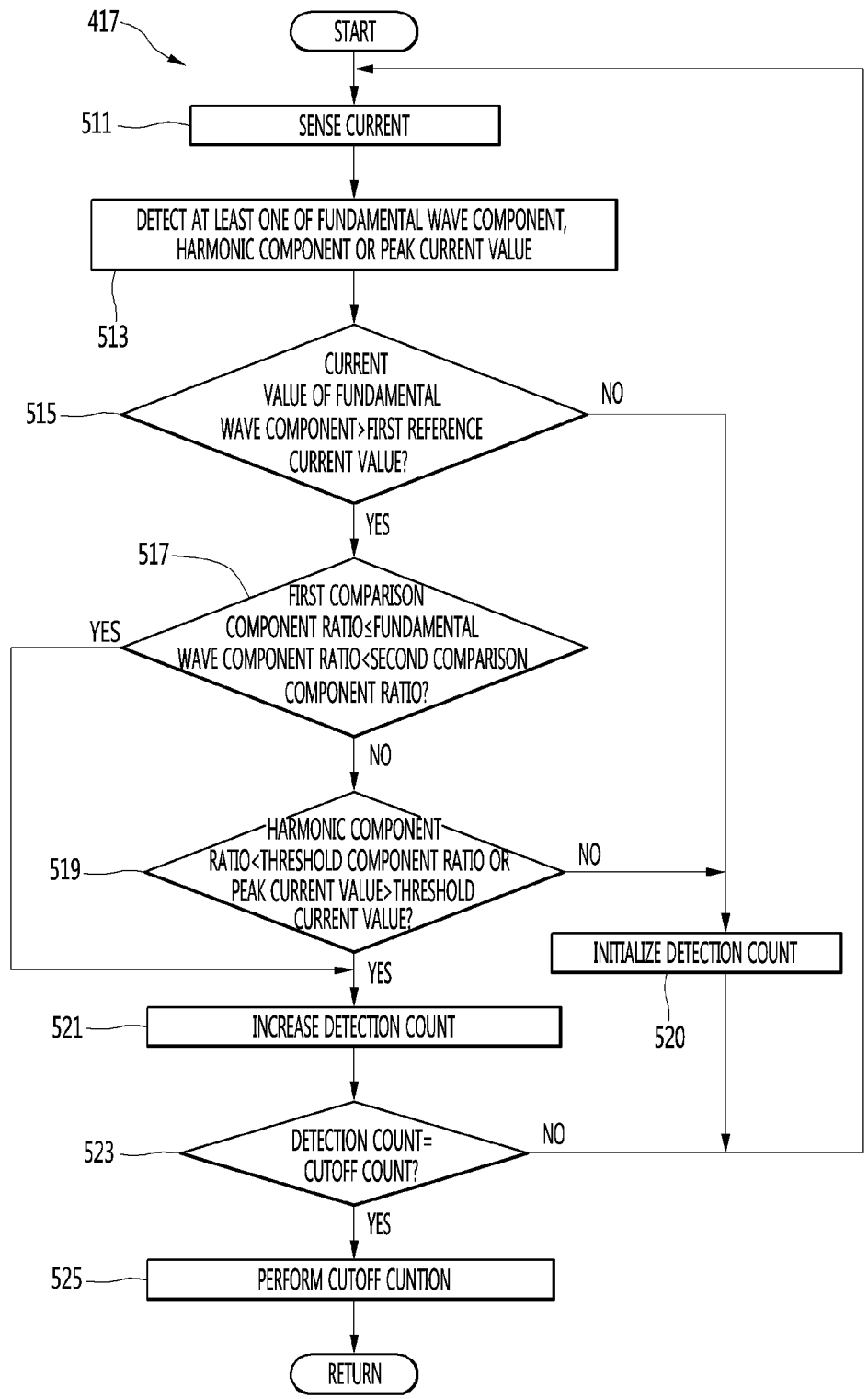
FIG. 5 is a flowchart illustrating operation of detecting leakage with second sensitivity in FIG. 4.

FIG. 5 is a flowchart illustrating operation of detecting leakage with second sensitivity in FIG. 4.

Referring to FIG. 5, first, the current sensing unit 140 senses current induced in the circuit in Operation 511. While the current sensing unit 140 senses the current in Operation 511, the controller 160 may detect at least one of the fundamental wave component, the harmonic component or the peak current value from the current in Operation 513. At this time, the controller 160 may detect the fundamental wave component from the current and further detect at least one of the third harmonic component or the peak current value. To this end, the controller 160 may convert the current from an analog signal into digital data and then perform Fourier transform with respect to the digital data.

Next, the controller 160 may compare the current value of the fundamental wave component with the first reference current value in Operation 515. At this time, the controller 160 may determine whether the current value of the fundamental wave component is equal to or greater than the first reference current value.

At this time, upon determining that the current value of the fundamental wave component is equal to or greater than the first reference current value in Operation 515, the controller 160 may compare the fundamental wave component ratio with at least one of a first comparison component ratio or the second comparison component ratio in the current in Operation 517. At this time, the controller 160 may determine whether the fundamental wave component ratio is equal to or greater than the first comparison component ratio and is less than the second comparison component ratio. For example, the first comparison component ratio may be set to 50% and the second comparison component ration may be set to 70%.

Next, upon determining that the fundamental wave component ratio is equal to or greater than the first comparison component ratio and is less than the second comparison component ratio in Operation 517, the controller 160 may increase the detection count in Operation 521. That is, if the fundamental wave component ratio is equal to or greater than the first comparison component ratio and is less than the second comparison component ratio, the controller 160 may determine that the current is abnormal current. For example, if the fundamental wave component ratio is equal to or greater than the first comparison component ratio and is less than the second comparison component ratio, the controller 160 may determine that abnormal current is generated due to grounding. Therefore, the controller 160 may increase the detection count in correspondence with abnormal current. For example, the controller 160 may increase the detection count from 0 to 1 or from 3 to 4 by 1. The controller 160 may determine whether the detection count reaches the predetermined cutoff count in Operation 323. For example, the cutoff count may be set to 10.

Finally, upon determining that the detection count reaches the predetermined cutoff count in Operation 523, the controller 160 may perform the cutoff function in Operation 525. At this time, the controller 160 may drive the cutoff unit 130, thereby cutting off the circuit. Thereafter, the controller 160 may be returned to FIG. 4.

Meanwhile, upon determining that the fundamental wave component ratio is less than the first comparison component ratio and is equal to or greater than the second comparison component ratio in Operation 517, the controller 160 may compare the harmonic component ratio with the threshold component ratio or compare the peak current value with the threshold current value in Operation 519. Here, the controller 160 may compare the third harmonic component ratio with the threshold component ratio. At this time, the controller 160 may determine whether the third harmonic component ratio is less than the threshold component ratio. For example, the threshold component ratio may be 50%. Alternatively, the controller 160 may determine whether the peak current value exceeds the threshold current value.

At this time, upon determining that the harmonic component ratio is less than the threshold component ratio or the peak current value exceeds the threshold current value in Operation 519, the controller 160 may proceed to Operation 521. That is, if the harmonic component ratio is less than the threshold component ratio or the peak current value exceeds the threshold current value, the controller 160 may determine that the current is abnormal current. For example, if the harmonic component ratio is less than the threshold component ratio or the peak current value exceeds the threshold current value, the controller 160 may determine that abnormal current is generated due to leakage.

Meanwhile, upon determining that the current value of the fundamental wave component is equal to or greater than the first reference current value in Operation 515, the controller 160 may initialize the detection count to 0 in Operation 520. That is, if the current value of the fundamental wave component is less than the first reference current value, the controller 160 may determine that the current is balanced current. Meanwhile, upon determining that the harmonic component ratio is equal to or greater than the threshold component ratio or the peak current value is equal to or less than the threshold current value in Operation 519, the controller 160 may initialize the detection count to 0 in Operation 520. That is, if the third harmonic component ratio is equal to or greater than the threshold component ratio or the peak current value is equal to or less than the threshold current value, the controller 160 may determine that the current is balanced current. In this case, the current may be generated due to the characteristics of the specific part in the earth leakage circuit breaker 100. Thereafter, the controller 160 may be returned to Operation 511. In addition, the controller 160 may perform at least one of Operation 511 to Operation 523.

According to various embodiments, the earth leakage circuit breaker 100 may determine whether abnormal current is generated based on the fundamental wave component of the current sensed from the circuit. That is, the earth leakage circuit breaker 100 may ignore current generated according to the characteristics of a specific part in the earth leakage circuit breaker 100, when determining whether abnormal current is generated. In addition, the earth leakage circuit breaker 100 may determine whether abnormal current is generated, by additionally considering at least one of the harmonic component of the current sensed in the circuit or the peak current value. Therefore, it is possible to improve accuracy when the earth leakage circuit breaker 100 determines whether abnormal current is generated. Therefore, it is possible to prevent malfunction of the earth leakage circuit breaker 100.

The terminology used herein is for the purpose of describing particular example embodiments only and is not intended to be limiting. As used herein, the singular forms are intended to include the plural forms as well, unless the context clearly indicates otherwise. Terms used herein, including technical or scientific terms, may have the same meaning as commonly understood by one of ordinary skill in the art. The generally predefined terms used in this disclosure may be interpreted in the same or similar meaning as the contextual meanings of the related art and are intended to mean ideal or overly formal meanings. In some cases, the terms defined in this disclosure cannot be construed as excluding the embodiments of this disclosure.

What is claimed is:

1. An earth leakage circuit breaker comprising:
 a current sensing unit configured to sense current in a circuit;
 a converter configured to detect a fundamental wave component and a specific harmonic component from the sensed current, the specific harmonic component being one of a plurality of harmonic components; and
 a controller,
 wherein the controller is configured:
 to compare a harmonic component ratio with a threshold component ratio,
 to determine whether the sensed current is abnormal current, and to control cutoff of the circuit according to the result of determination, wherein the harmonic component ratio is a ratio of the specific harmonic component to the fundamental wave component, and wherein the converter is configured:

to convert the sensed current from an analog signal into digital data, and to perform Fourier transform with respect to the converted digital data to detect the fundamental wave component and the specific harmonic component.

2. The earth leakage circuit breaker according to claim 1, wherein the abnormal current is caused by leakage.

3. The earth leakage circuit breaker according to claim 1, wherein the controller compares a current value of the detected fundamental wave component with a predetermined reference current value and determines whether the sensed current is abnormal current.

4. The earth leakage circuit breaker according to claim 3, wherein the abnormal current is caused by grounding.

5. The earth leakage circuit breaker according to claim 3, wherein the controller determines whether the sensed current is abnormal current by a predetermined count when the current is abnormal current.

6. The earth leakage circuit breaker according to claim 5, wherein the controller performs control to drive a cutoff unit to cut off the circuit, when the sensed current is abnormal current.

7. The earth leakage circuit breaker according to claim 3, wherein the reference current value includes:

a first reference current value set according to sensitivity of the abnormal current; and a second reference current value set to distinguish the abnormal current and exceeding the first reference current value.

8. The earth leakage circuit breaker according to claim 7, wherein the controller determines that the current is abnormal current due to grounding, when the current value of the fundamental wave component exceeds the second reference current value.

9. The earth leakage circuit breaker according to claim 8, wherein the controller compares the harmonic component ratio with a predetermined threshold component ratio when a current value of the fundamental wave component is equal to or greater than the first reference current value and is equal to or less than the second reference current value, and determines that the current is abnormal current due to leakage when the harmonic component ratio is less than the threshold component ratio.

10. The earth leakage circuit breaker according to claim 9, wherein the controller determines that the current has balanced current, when the current value of the fundamental wave component is less than the first reference current value or when the harmonic component ratio is equal to or greater than the threshold component ratio.

11. The earth leakage circuit breaker according to claim 10, wherein the controller:

compares the fundamental wave component ratio of the sensed current with a predetermined range when the current value of the fundamental wave component is equal to or greater than the reference current value, compares the harmonic component ratio of the sensed current with a predetermined threshold component ratio when the fundamental wave component is out of the predetermined range, determines whether the current is abnormal current when the fundamental wave component ratio is in the predetermined range or when the harmonic component ratio is less than the threshold component ratio, and determines that the current has balanced current when the current value of the fundamental wave component is less than the reference current value or when the harmonic component ratio is equal to or greater than the threshold component ratio.

12. The earth leakage circuit breaker according to claim 10, wherein the controller:

compares the fundamental wave component ratio of the sensed current with a predetermined range when the current value of the fundamental wave component is equal to or greater than the reference current value, compares a peak current value of the sensed current with a predetermined threshold current value when the fundamental wave component is out of the predetermined range, determines whether the current is abnormal current when the fundamental wave component ratio is in the predetermined range or when the peak current value exceeds the threshold current value, and determines that the current is balanced current when the current value of the fundamental wave component is less than the reference current value or when the peak current value is equal to or less than the threshold current value.

13. The earth leakage circuit breaker according to claim 10, wherein the controller:

increases a detection count of the abnormal current when the current is abnormal current and cuts off the circuit when the detection count reaches a predetermined count, and initializes the detection count of the abnormal current when the current has balanced current.

* * * * *